(12) United States Patent
Choi et al.

(10) Patent No.: US 8,040,920 B2
(45) Date of Patent: Oct. 18, 2011

(54) DIGITAL BROADCASTING SYSTEM AND METHOD OF PROCESSING DATA

(75) Inventors: In Hwan Choi, Gyeonggi-do (KR); Kook Yeon Kwak, Gyeonggi-do (KR); Byoung Gill Kim, Seoul (KR); Jin Woo Kim, Seoul (KR); Hyoung Gon Lee, Seoul (KR); Jong Moon Kim, Gyeonggi-do (KR); Won Gyu Song, Seoul (KR)

(73) Assignee: LG Electronics Inc., Seoul (KR)

( * ) Notice: Subject to any disclaimer, the term of this patent is extended or adjusted under 35 U.S.C. 154(b) by 339 days.

(21) Appl. No.: 11/960,561

(22) Filed: Dec. 19, 2007

(65) Prior Publication Data

US 2008/0159333 A1 Jul. 3, 2008

(30) Foreign Application Priority Data

Dec. 19, 2006 (KR) .................. 10-2006-0130276

(51) Int. Cl.
*H04H 20/28* (2008.01)

(52) U.S. Cl. ........ 370/487; 370/516; 714/758; 375/371; 348/497

(58) Field of Classification Search .................. None
See application file for complete search history.

(56) References Cited

U.S. PATENT DOCUMENTS

| | | | |
|---|---|---|---|
| 5,452,288 A * | 9/1995 | Rahuel et al. .................. 370/203 |
| 5,640,388 A * | 6/1997 | Woodhead et al. ........... 370/468 |
| 7,450,613 B2 * | 11/2008 | Choi et al. ..................... 370/486 |
| 2002/0172154 A1 | 11/2002 | Uchida et al. |
| 2002/0172281 A1 * | 11/2002 | Mantchala et al. ....... 375/240.12 |
| 2004/0162078 A1 * | 8/2004 | Ramaswamy et al. ........ 455/445 |
| 2005/0238061 A1 * | 10/2005 | Woodward, Jr. .............. 370/516 |
| 2006/0246836 A1 * | 11/2006 | Simon .......................... 455/3.01 |
| 2006/0262863 A1 * | 11/2006 | Park et al. ................. 375/240.26 |
| 2007/0115969 A1 * | 5/2007 | Isnardi .......................... 370/389 |
| 2007/0253503 A1 * | 11/2007 | Kim et al. ...................... 375/265 |
| 2007/0277210 A1 * | 11/2007 | Yousef ........................... 725/113 |
| 2010/0173602 A1 * | 7/2010 | Muramatsu ................ 455/404.1 |

FOREIGN PATENT DOCUMENTS

| | | |
|---|---|---|
| JP | 2000-224136 A | 8/2000 |
| WO | 200201849 A1 | 1/2002 |
| WO | 2005064942 A1 | 7/2002 |

\* cited by examiner

*Primary Examiner* — Chi Pham
*Assistant Examiner* — Mohammad Adhami
(74) *Attorney, Agent, or Firm* — Lee, Hong, Degerman, Kang & Waimey

(57) ABSTRACT

A digital broadcasting system and method of processing data are disclosed. Herein, a method of processing data in a transmitting system includes creating a data group including a plurality of mobile service data packets, re-adjusting a relative position of at least one main service data packet of a main service data section, the main service data section including a plurality of main service data packets, and multiplexing the mobile service data of the data group and the main service data of the main service data section in burst units. Herein, a position of an audio data packet among the main service data packets of the main service data section may be re-adjusted. Also, a position of an audio data packet included in the main service data section may be re-adjusted based upon a multiplexing position of the main service data section.

18 Claims, 6 Drawing Sheets

DIGITAL BROADCASTING SYSTEM AND METHOD OF PROCESSING DATA

This application claims the benefit of the Korean Patent Application No. 10-2006-0130276, filed on Dec. 19, 2006, which is hereby incorporated by reference as if fully set forth herein. This application also claims the benefit of U.S. Provisional Application No. 60/871,408, filed on Dec. 21, 2006, which is hereby incorporated by reference.

BACKGROUND OF THE INVENTION

1. Field of the Invention

The present invention relates to a digital broadcasting system, and more particularly, to a digital broadcasting system and a method of processing data that can receive and transmit (or process) digital broadcast signals.

2. Discussion of the Related Art

The Vestigial Sideband (VSB) transmission method, which is adopted as the standard for digital broadcasting in North America and the Republic of Korea, is a system using a single carrier method. Therefore, the receiving performance of the receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission method.

SUMMARY OF THE INVENTION

Accordingly, the present invention is directed to a digital broadcasting system and a data processing method that substantially obviate one or more problems due to limitations and disadvantages of the related art.

An object of the present invention is to provide a digital broadcasting system and a method of processing data that are highly resistant to channel changes and noise.

Another object of the present invention is to provide a digital broadcasting system and a method of processing data that can enhance the receiving performance of a receiving system by performing additional encoding on mobile service data and by transmitting the processed data to the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of processing data in a transmitting system of a digital broadcasting system may include creating a data group including a plurality of mobile service data packets, re-adjusting a relative position of at least one main service data packet of a main service data section, the main service data section including a plurality of main service data packets, and multiplexing the mobile service data of the data group and the main service data of the main service data section in burst units. Herein, a position of an audio data packet among the main service data packets of the main service data section may be re-adjusted. Also, a position of an audio data packet included in the main service data section may be re-adjusted based upon a multiplexing position of the main service data section.

In another aspect of the present invention, a service multiplexer in a transmitting system includes a main service multiplexer, a mobile service multiplexer, and a multiplexer. The main service multiplexer multiplexes compression-encoded main service data and main ancillary data. The mobile service multiplexer multiplexes compression-encoded mobile service data and mobile ancillary data. And, the multiplexer multiplexes output data of the main service multiplexer and output data of the mobile service multiplexer, thereby outputting the multiplexed data to at least one transmitter located in a remote site.

In a further aspect of the present invention, a transmitter of a digital broadcast transmitting system includes a demultiplexer, a packet jitter mitigator, a pre-processor, and multiplexer. The demultiplexer receives and demultiplexes multiplexed main service data and mobile service data. The packet jitter mitigator adjusts a position of at least one main service data packet included in a main service data section, the main service data packet being demultiplexed and outputted from the demultiplexer. The pre-processor performs additional encoding on the mobile service data being demultiplexed and outputted from the demultiplexer, and creates a data group including a plurality of encoded mobile service data packets. And, the multiplexer multiplexes and outputs, in burst units, the mobile service data of the data group being outputted from the pre-processor and the main service data of the main service data section being outputted from the packet jitter mitigator.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the mobile service data may either consist of data including information such as program execution files, stock information, weather forecast, and so on, or consist of audio/video (A/V) data. Additionally, the known data refer to data already known based upon a pre-determined agreement between the transmitter and the receiver. Furthermore, the main service data consist of data that can be received from the conventional receiving system, wherein the main service data include A/V data. Also, a data service using the mobile service data may include weather forecast services, traffic information services, stock information services, viewer participation quiz programs, real-time polls & surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

The present invention relates to a transmission system that can be compatible with the conventional transmission method. Additionally, the transmission system may also multiplex the main service data and mobile service data of the same channel, and then, transmit the multiplexed data. When using the transmitting system according to the present invention, the mobile service data may be received while the user is in a mobile state (i.e., traveling). Also, the mobile service data may be received with stability despite the noise and diverse distortion occurring in the channel.

Furthermore, the transmitting system according to the present invention may perform additional encoding, and insert data pre-known by both transmitting and receiving systems (i.e., known data) and transmit the processed data, thereby enhancing the receiving performance. The present invention may also mitigate packet jitter when multiplexing the main service data and the mobile service data.

Figure 1:
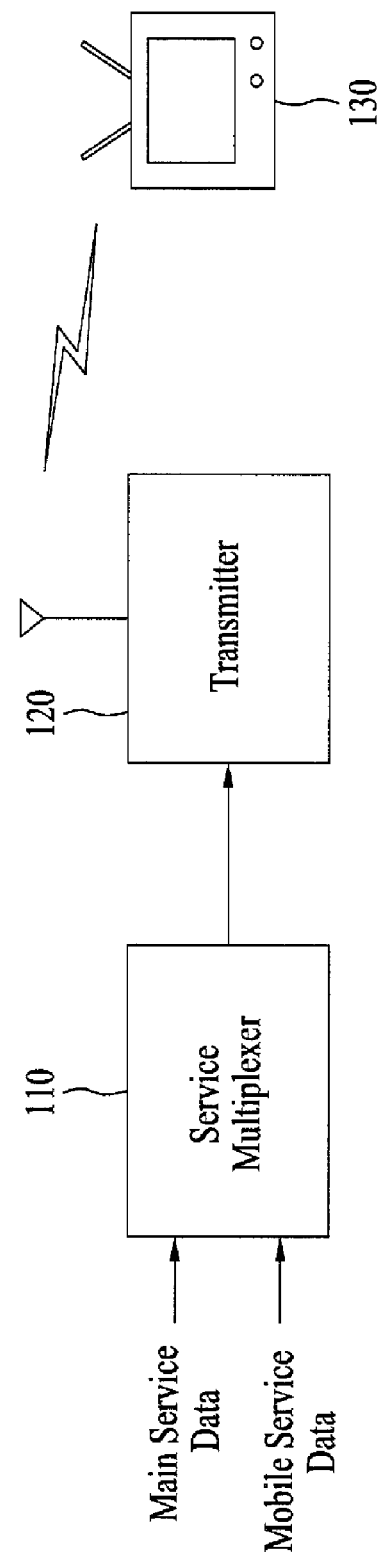
FIG. 1 illustrates a block diagram showing a general structure of a digital broadcasting system according to an embodiment of the present invention.

FIG. 1 illustrates a block diagram showing a general structure of a transmitting system according to an embodiment of the present invention. Herein, the transmitting system includes a service multiplexer 110 and a transmitter 120. Herein, the service multiplexer 110 is located in the studio of each broadcast station, and the transmitter 120 is located in a specific predetermined site. The transmitter 120 may be located in a plurality of different locations. Also, the plurality of transmitters may share the same frequency. And, in this case, the plurality of transmitters transmits the same signal. Accordingly, in the receiving system 130, a channel equalizer may compensate signal distortion, which is caused by a reflected wave, so as to recover the original signal. A variety of methods may be used for data communication each of the transmitters 120, which are located in remote positions, and the service multiplexer 110. For example, an interface standard such as a synchronous serial interface for transport of MPEG-2 data (SMPTE-310M).

Figure 2:
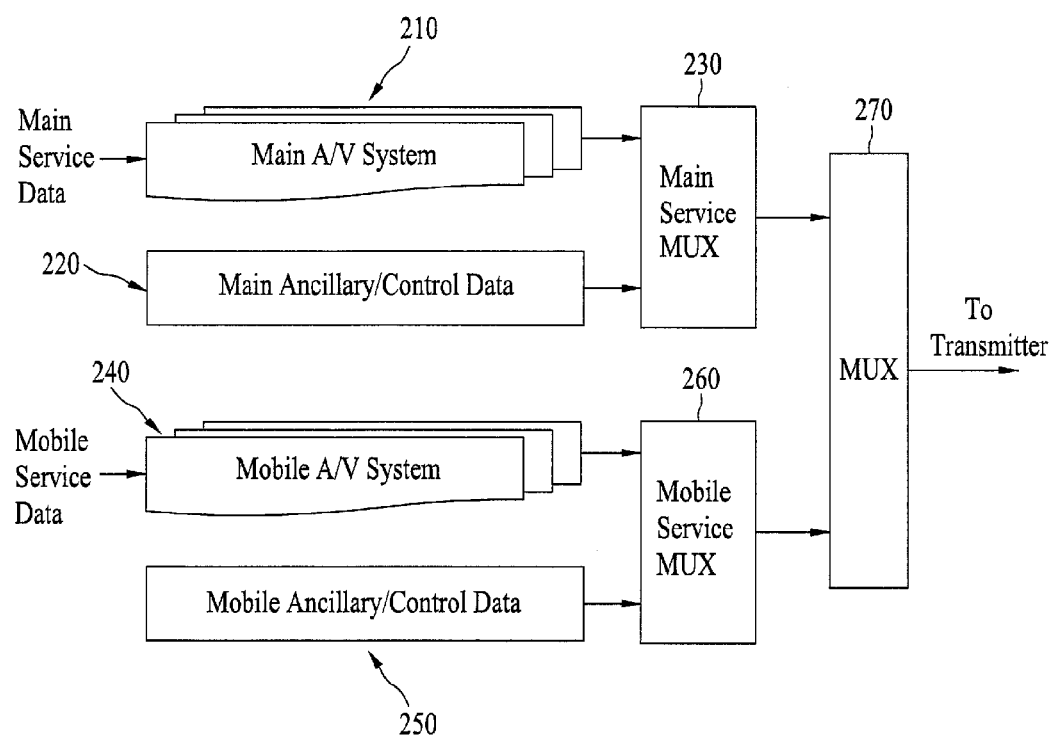
FIG. 2 illustrates a block diagram showing an example of a service multiplexer of FIG. 1.

FIG. 2 illustrates a block diagram of a service multiplexer according to an embodiment of the present invention. Referring to FIG. 2, the service multiplexer includes a main service multiplexer 230 for multiplexing and outputting main service data, a mobile service multiplexer 260 for multiplexing and outputting mobile service data, and a multiplexer 270 for multiplexing and outputting the service data from both service multiplexers 230 and 260. More specifically, the main service data are encoded and compressed by a main A/V system 210, which are then output to the main service multiplexer 230. Herein, if there is a plurality of main service data types, a plurality of main A/V systems may be provided. The main service multiplexer 230 multiplexes the output of the main A/V system 210 and main ancillary/control data 220 and, then, outputs the multiplexed data to the multiplexer 270.

Similarly, the mobile service data are encoded and compressed by a mobile A/V system 240, which are then output to the mobile service multiplexer 260. Herein, if there is a plurality of mobile service data types, a plurality of mobile A/V systems may be provided. The mobile service multiplexer 260 multiplexes the output of the mobile A/V system 240 and mobile ancillary/control data 250 and, then, outputs the multiplexed data to the multiplexer 270.

The multiplexer 270 multiplexes the output of the main service multiplexer 230 and the output of the mobile service multiplexer 260 and, then, outputs the multiplexed data to at least one of the transmitters. The output data of the multiplexer 270 is configured to have a MPEG-2 transport stream (TS) format. At this point, if the service data being transmitted to the transmitter 120 from the service multiplexer 110, are configured only of the main service data, the service multiplexer 110 transmits the main service data to the transmitter 120 at a data rate of approximately 19.39 Mbps.

However, when the service multiplexer 110 multiplexes the main service data and the mobile service data and outputs the multiplexed data to the transmitter 120, the service multiplexer 110 transmits the main service data at a data rate lower than 19.39 Mbps. This applies more to the mobile service data, since additional error correction encoding is performed by the transmitter 120, thereby reducing the data rate. Therefore, the output data rate of the multiplexer 270 included in the service multiplexer 110, which multiplexes and outputs main service data and mobile service data, is always equal to or less than 19.39 Mbps.

If the output of the service multiplexer 110 is required to be maintained at a constant data rate (e.g., at 19.39 Mbps), null data or null data packet are/is inserted in at least one of the main service multiplexer 230, the mobile service multiplexer 260, and the multiplexer 270, thereby setting the data rate of the final output data to a constant data rate. For example, when a main service data rate is set to 15 Mbps, and when a mobile service data rate is set to 1 Mbps, and when the output data rate of the service multiplexer 110 is required to be maintained at 19.39 Mbps, the multiplexer 270 may insert null data or a null data packet to the final output data, thereby setting the final output data rate to 19.39 Mbps. Herein, the null data may be generated from the multiplexer 270 or generated from an external part.

The transmitter 120 receiving the null data should first remove the null data and then process the remaining data. Therefore, identification information for identifying the null data is required by the transmitter 120. A multiplexer for inserting the null data multiplexing and transmitting the identification information along with the null data will be given as an exemplary embodiment of the present invention.

For example, when the multiplexer 270 inserts null data, identification information for identifying the null data is also multiplexed and transmitted by the multiplexer 270. Herein, the identification information may use a value pre-decided based upon an agreement between the transmitting system and the receiving system, or the identification information may be configured as a separate set of data. Alternatively, the identification information may also use a modified position value, the position value being predetermined in the null data packet.

For example, in the present invention, a synchronization byte value within a header of a null data packet may be modified, so as to be used as the identification information. Alternatively, a transport_error_indicator_flag may be set to '1', so as to be used as the identification information. Herein, any value that can identify the null data may be used as the identification information. Therefore, the present invention is not limited only to the examples given in the description set forth herein.

Meanwhile, the main service ancillary data may include main service program specific information (PSI)/program and system information protocol (PSIP) information. Similarly, the mobile service ancillary data may include mobile service PSI/PSIP information. Additionally, mobile service control data may also be included. And, in this case, information for controlling a transmission network may also be included in the control data. Furthermore, when the multiplexer 270 multiplexes the main service data packet and the mobile service data packet, the multiplexer 270 may include a packet identifier (PID) for identifying each of the main service data packet and the mobile service data packet, respectively. In another example, a bitwise inversion may be performed on a MPEG synchronization byte of the mobile service data packet, so as to identify the mobile service data packet from the main service data packet.

Figure 3:
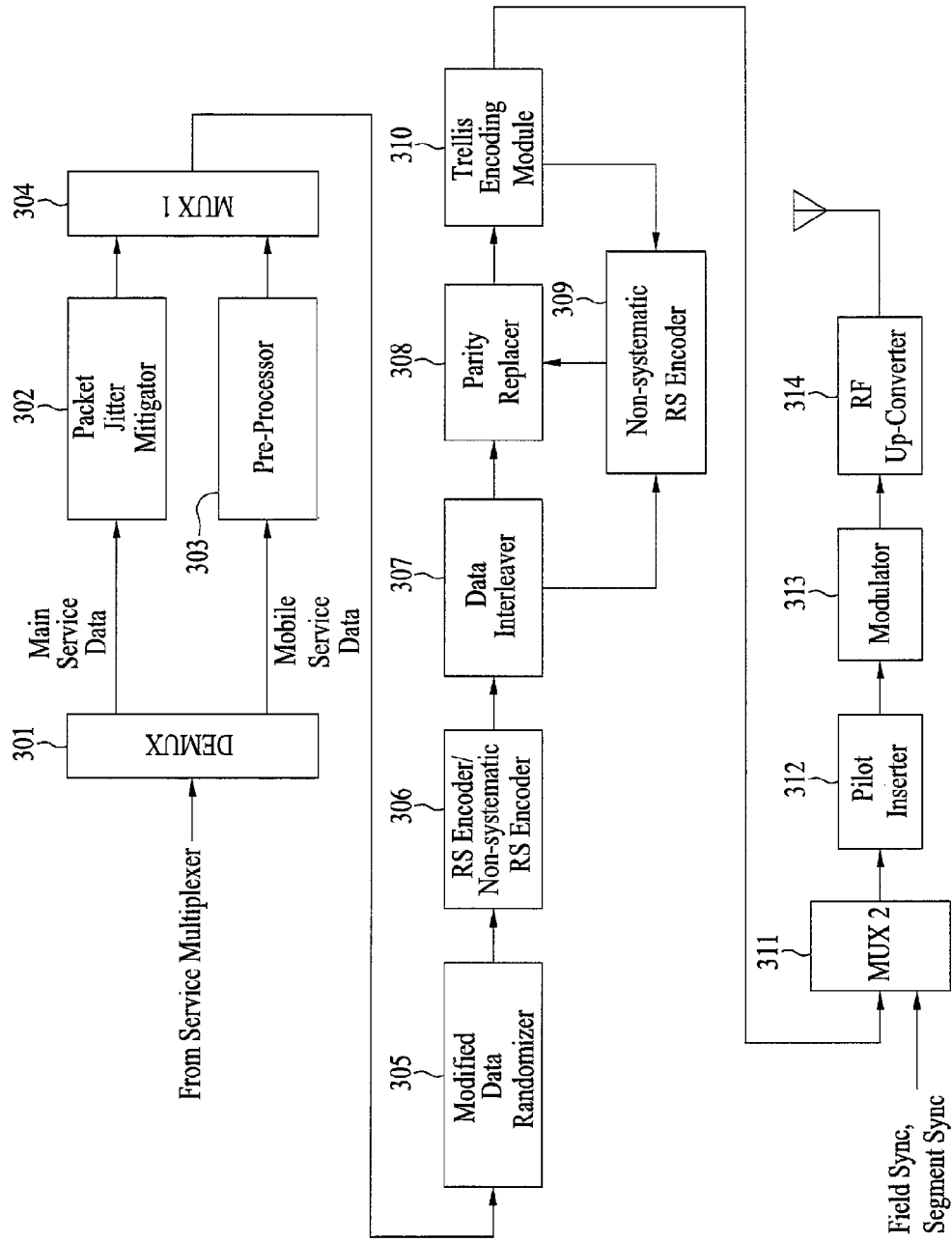
FIG. 3 illustrates a block diagram showing an example of a pre-processor of FIG. 2.

FIG. 3 illustrates a block diagram of a transmitter according to the present invention. Referring to FIG. 3, the transmitter includes a demultiplexer (DEMUX) 301, a packet jitter mitigator 302, an pre-processor 303, and a first multiplexer 304. Additionally, the transmitter also includes a data randomizer 305, a RS encoder/non-systematic RS encoder 306, a data interleaver 307, a parity replacer 308, a non-systematic RS encoder 309, a trellis-encoding module 310, a second multiplexer 311, a pilot inserter 312, a modulator 313, and a radio frequency (RF)-up converter 314.

Figure 4:
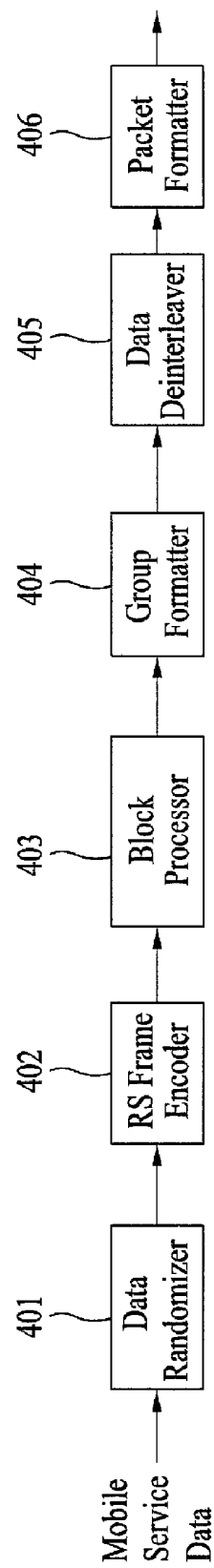
FIG. 4 illustrates a block diagram showing an example of a transmitter of FIG. 1.

FIG. 4 illustrates a block diagram of the pre-processor 303 according to an embodiment of the present invention. Herein, the pre-processor 303 includes a data randomizer 401, a RS frame encoder 402, a block processor 403, a group formatter 404, a data deinterleaver 405, and a packet formatter 406. In transmitter having the above-described structure, the demultiplexer 301 separates main service data and mobile service data by demultiplexing the data transmitted from the service multiplexer. Then, the separated main service data are outputted to the packet jitter mitigator 302, and the separated mobile service data are outputted to the pre-processor 303.

At this point, when the service multiplexer 110 inserts null data in order to match the data rate and transmits the processed data, the demultiplexer 301 refers to identification information transmitted along with the processed data so as to discard the null data. Then, the demultiplexer 301 demultiplexes only remaining data, which are then output to each corresponding block. The pre-processor 303 performs additional encoding so that the mobile service data can respond more effectively to noise and channel environment that undergoes frequent changes. For this, the mobile service data separated by the demultiplexer 301 are output to the data randomizer 401 of the pre-processor 303.

The data randomizer 401 receives mobile service data and randomizes the received data, thereby outputting the processed mobile service data to the RS frame encoder 402. At this point, by having the data randomizer 401 randomize the mobile service data, a later randomizing process on the mobile service data performed by a data randomizer 305, which is positioned in a later block, may be omitted. The randomizer of the conventional system may be identically used as the randomizer for randomizing the mobile service data. Alternatively, any other type of randomizer may also be used for this process.

The RS frame encoder 402 performs at least one of an error correction encoding process and an error detection encoding process on the inputted randomized mobile service data so as to provide robustness on the corresponding mobile service data. Thus, by providing robustness on the mobile service data, a group error that may occur due to a change in the frequency environment can be scattered, thereby enabling the corresponding data to respond to the severely vulnerable and frequently changing frequency environment. The RS frame encoder 402 may also include a row permutation process, which permutes mobile service data having a predetermined size in row units. Herein, RS encoding is applied as the error correction encoding process, and cyclic redundancy check (CRC) encoding is applied as the error detection encoding process. When performing RS encoding, parity data that are to be used for error correction are generated. And, when performing CRC encoding, CRC data that are to be used for error detection are generated.

In this embodiment of the present invention, the RS encoding will be adopting a forward error correction (FEC) method. The FEC corresponds to a technique for compensating errors that occur during the transmission process. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system.

As described above, the mobile service data encoded by the RS frame encoder 402 are inputted to the block processor 403. The block processor 403 then encodes the inputted mobile service data at a coding rate of G/H (wherein, G is smaller than H (i.e., G<H)) and then outputted to the group formatter 404. More specifically, the block processor 113 divides the mobile service data being inputted in byte units into bit units. Then, the G number of bits is encoded to H number of bits. Thereafter, the encoded bits are converted back to byte units and then outputted. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). Hereinafter, the former coding rate will be referred to as a coding rate of ½ (½-rate coding), and the latter coding rate will be referred to as a coding rate of ¼ (¼-rate coding), for simplicity.

Herein, when using the ¼ coding rate, the coding efficiency is greater than when using the ½ coding rate, and may, therefore, provide greater and enhanced error correction ability. For such reason, when it is assumed that the data encoded at a ¼ coding rate in the group formatter 404, which is located near the end portion of the system, are allocated to a region in which the receiving performance may be deteriorated, and that the data encoded at a ½ coding rate are allocated to a region having excellent receiving performance, the difference in performance may be reduced. At this point, the block processor 403 may also receive additional information data, such as signaling information including system information.

Herein, the additional information data may also be processed with either ½-rate coding or ¼-rate coding as in the step of processing the enhance data. Thereafter, additional information data, such as signaling information, is also considered the same as the mobile service data and processed accordingly. The signaling information is information required that a receiving system receives and processes data included in a data group. The signaling information may include data group information, multiplexing information, burst information, and so on.

Meanwhile, the group formatter 404 inserts mobile service data that are outputted from the block processor 403 in corresponding regions within a data group, which is configured in accordance with a pre-defined rule. Also, with respect to the data deinterleaving process, each place holder or known data are also inserted in corresponding regions within the data group. At this point, the data group may be divided into at least one hierarchical region. Herein, the type of mobile service data being inserted to each region may vary depending upon the characteristics of each hierarchical region. For example, each region may be divided based upon the receiving performance within the data group.

Herein, the data group is divided into a plurality of different regions so that each region can be used for different purposes. More specifically, a region having less or no interference from the main service data may provide a more enhanced (or powerful) receiving performance as compared to a region having relatively more interference from the main service data. Furthermore, when using a system inserting and transmitting known data into the data group, and when a long known data sequence is to be consecutively inserted into the mobile service data, a known data sequence having a predetermined length may be consecutively inserted into a region having no interference from the main service data. Conversely, in case of the regions having interference from the main service data, it is difficult to consecutively insert long known data sequences and to periodically insert the known data into the corresponding regions due to the interference from the main service data.

In addition, the group formatter 404 also inserts supplemental (or ancillary) data, such as signaling information that notifies the overall transmission information, other than the mobile service data in the data group. Also, apart from the encoded mobile service data outputted from the block processor 403, the group formatter 404 also inserts MPEG header place holders, non-systematic RS parity place holders, main service data place holders, which are related to data deinterleaving in a later process. Herein, the main service data place holders are inserted because the mobile service data bytes and the main service data bytes are alternately mixed with one another based upon the input of the data deinterleaver. For example, based upon the data outputted after the data-deinterleaving process, the place holder for the MPEG header may be allocated at the very beginning of each packet.

Furthermore, the group formatter 404 either inserts known data generated in accordance with a pre-determined method or inserts known data place holders for inserting the known data in a later process. Additionally, place holders for initializing the trellis encoding module 310 are also inserted in the corresponding regions. For example, the initialization data place holders may be inserted in the beginning of the known data sequence. Herein, the size of the mobile service data that can be inserted in a data group may vary in accordance with the sizes of the trellis initialization data or known data, MPEG headers, and RS parity data.

The output of the group formatter 404 is inputted to the data deinterleaver 405. And, the data deinterleaver 405 deinterleaves data by performing an inverse process of the data interleaver on the data and place holders within the data group, which are then outputted to the packet formatter 406. The packet formatter 406 removes the main service data place holders and the RS parity place holders that were allocated for the deinterleaving process from the deinterleaved data being inputted. Then, the packet formatter 406 groups the remaining portion and replaces the 4-byte MPEG header place holder with an MPEG. Also, when the group formatter 404 inserts known data place holders, the packet formatter 406 may insert actual known data in the known data place holders, or may directly output the known data place holders without any modification in order to make replacement insertion in a later process. Thereafter, the packet formatter 406 identifies the data within the packet-formatted data group, as described above, as a 188-byte unit mobile service data packet (i.e., MPEG TS packet), which is then provided to the first multiplexer 304.

Figure 5:
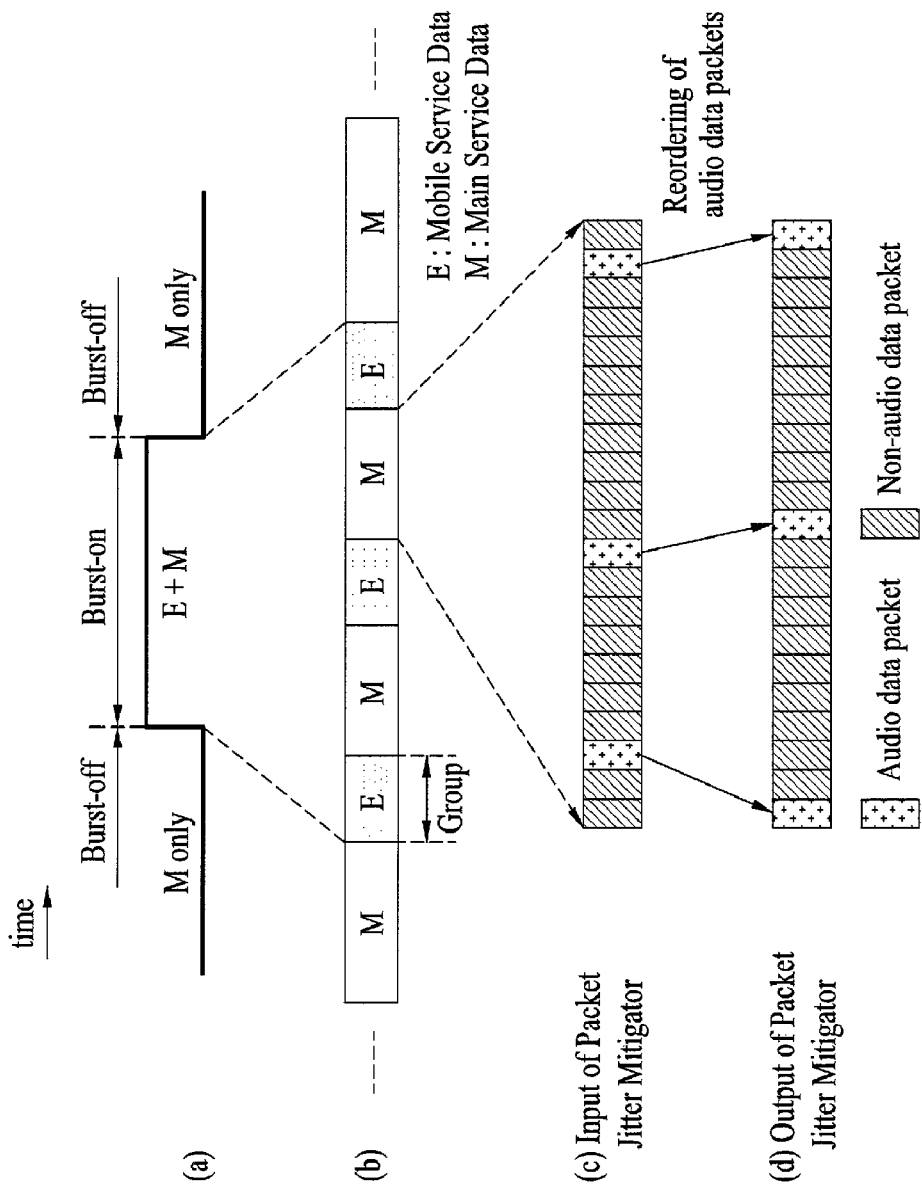
FIG. 5(a) to FIG. 5(d) illustrate a process of realigning main service data according to an embodiment of the present invention.

The first multiplexer 304 multiplexes the mobile service data packet of the 188-byte unit outputted from the packet formatter 406 and the main service data packet in accordance with a pre-defined multiplexing method. Then, the first multiplexer 304 outputs the multiplexed data packets to the data randomizer 305. Herein, the multiplexing method may vary in accordance with various variables of the system design. One of the multiplexing methods of the first multiplexer 304 consists of providing a burst-on section and burst-off section along a time axis, as shown in FIG. 5(*a*), and, then, transmitting a plurality of data groups during a burst-on section and transmitting only the main service data during the burst-off section. At this point, main service data may also be transmitted in the burst-on section. More specifically, as shown in FIG. 5(*b*), a plurality of consecutive mobile service data packets are grouped to form a data group. And, a plurality of such data groups is mixed with main service data packets so as to create a burst-on section.

In this case, mobile service data and main service data co-exist in a burst-on section, as shown in FIG. 5(*a*), and only the main service data exist in the burst-off section. Therefore, the main service data section transmitting the main service data exist in both the burst-on section and the burst-off section. At this point, the number of main service data packets included in the main service data section within the burst-on section and the number of main service data packets included in the main service data section within the burst-off section may be equal to or different from one another. When the mobile service data are transmitted in burst units, as described above, a receiving system that only receives the mobile service data may turn on the power only during the burst-on section so as to receive the corresponding data. Also, in this case, the receiving system may turn off the power during burst-off section, thereby preventing the main service data from being received. Thus, the receiving system is capable of reducing excessive power consumption.

However, since a data group including mobile service data in-between the data bytes of the main service data during the packet multiplexing process, the shifting of the chronological position (or place) of the main service data packet becomes relative. Also, a system object decoder (i.e., MPEG decoder) for processing the main service data of the digital broadcast receiving system, receives and decodes only the main service data and recognizes the mobile service data packet as a null data packet. Therefore, when the system object decoder of the receiving system receives a data group including mobile service data and a main service data packet that is multiplexed with the data group, a packet jitter occurs.

At this point, since a multiple-level buffer for the video data exists in the system object decoder and the size of the buffer is relatively large, the packet jitter generated from the first multiplexer 304 does not cause any serious problem in case of the video data. However, since the size of the buffer for the audio data is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 302 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. FIG. 5(*c*) illustrates, in TS packet units, a main service data section within the burst-on section that is being inputted to the packet jitter mitigator 302 of the transmitter. The packet jitter mitigator 302 repositions audio packets of the main service data section, as shown in FIG. 5(*d*), so that the audio data packets of the main service can be positioned as equally and uniformly as possible. The standard for repositioning the audio data packets in the main service data performed by the packet jitter mitigator 302 will now be described. Herein, it is assumed that the packet jitter mitigator 302 knows the same multiplexing information as that of the first multiplexer 304, which is placed further behind the packet jitter mitigator 302.

Firstly, if one audio data packet exists in the main service data section (e.g., the main service data section positioned between two data groups) within the burst-on section, the audio data packet is positioned at the very beginning of the main service data section. Alternatively, if two audio data packets exist in the corresponding data section, one audio data packet is positioned at the very beginning and the other audio data packet is positioned at the very end of the main service data section. Further, if more than three audio data packets exist, one audio data packet is positioned at the very beginning of the main service data section, another is positioned at the very end of the main service data section, and the remaining audio data packets are positioned between the first and last audio data packets at equal intervals (as shown in FIG. 5(*c*) and FIG. 5(*d*)).

Secondly, during the main service data section within the burst-off section, which is placed immediately before the beginning of a burst-on section (i.e., during a burst-off section), the audio data packet is placed at the very end of the main service data section. Thirdly, during a main service data section within the burst-off section subsequent to the burst-on section, the audio data packet is positioned at the very beginning of the main service data section. And, finally, the data packets other than audio data packets are positioned in accordance with the inputted order in vacant spaces (i.e., spaces that are not designated for the audio data packets). Meanwhile, when the positions of the main service data packets are relatively re-adjusted, associated program clock reference (PCR) values may also be modified accordingly. The PCR value corresponds to a time reference value for synchronizing the time of the system target decoder. Herein, the PCR value is inserted in a specific region of a TS packet and then transmitted.

In the example of the present invention, the packet jitter mitigator 302 also performs the operation of modifying the PCR value. The output of the packet jitter mitigator 302 is inputted to the first multiplexer 304. As described above, the first multiplexer 304 multiplexes the main service data packet outputted from the packet jitter mitigator 302 with the mobile service data packet outputted from the pre-processor 303 into a burst structure in accordance with a pre-determined multiplexing rule. Then, the first multiplexer 304 outputs the multiplexed data packets to the data randomizer 305.

If the inputted data correspond to the main service data packet, the data randomizer 305 performs the same randomizing process as that of the conventional randomizer. More specifically, the synchronization byte within the main service data packet is deleted. Then, the remaining 187 data bytes are randomized by using a pseudo random byte generated from the data randomizer 305. Thereafter, the randomized data are outputted to the RS encoder/non-systematic RS encoder 306.

On the other hand, if the inputted data correspond to the mobile service data packet, the data randomizer 305 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 306. Additionally, the randomizing process is not performed on the remaining portion of the mobile service data excluding the MPEG header. In other words, the remaining portion of the mobile service data packet is directly outputted to the RS encoder/non-systematic RS encoder 306 without being randomized. This is because a randomizing process has already been performed on the mobile service data in the data randomizer 401. Also, the data randomizer 305 may or may not perform a randomizing process on the known data (or known data place holders) and the initialization data place holders included in the mobile service data packet.

The RS encoder/non-systematic RS encoder 306 performs an RS encoding process on the data being randomized by the data randomizer 305 or on the data bypassing the data randomizer 305, so as to add 20 bytes of RS parity data. Thereafter, the processed data are outputted to the data interleaver 307. Herein, if the inputted data correspond to the main service data packet, the RS encoder/non-systematic RS encoder 306 performs the same systematic RS encoding process as that of the conventional system, thereby adding the 20-byte RS parity data at the end of the 187-byte data. Alternatively, if the inputted data correspond to the mobile service data packet, the RS encoder/non-systematic RS encoder 306 performs a non-systematic RS encoding process. At this point, the 20-byte RS parity data obtained from the non-systematic RS encoding process are inserted in a pre-decided parity byte place within the mobile service data packet.

The data interleaver 307 corresponds to a byte unit convolutional interleaver. The output of the data interleaver 307 is inputted to the parity replacer 308 and to the non-systematic RS encoder 309. Meanwhile, a process of initializing a memory within the trellis encoding module 310 is primarily required in order to decide the output data of the trellis encoding module 310, which is located after the parity replacer 308, as the known data pre-defined according to an agreement between the receiving system and the transmitting system. More specifically, the memory of the trellis encoding module 310 should first be initialized before the received known data sequence is trellis-encoded.

At this point, the beginning portion of the known data sequence that is received corresponds to the initialization data place holder and not to the actual known data. Herein, the initialization data place holder has been included in the data by the group formatter 404 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 310. Further, due to the newly replaced initialization data, a process of newly calculating the RS parity and replacing the RS parity, which is outputted from the data interleaver 307, with the newly calculated RS parity is required. Therefore, the non-systematic RS encoder 309 receives the mobile service data packet including the initialization data place holders, which are to be replaced with the actual initialization data, from the data interleaver 307 and also receives the initialization data from the trellis encoding module 310.

Among the inputted mobile service data packet, the initialization data place holders are replaced with the initialization data, and the RS parity data that are added to the mobile service data packet. Thereafter, a new non-systematic RS parity is calculated and then outputted to the parity replacer 308. Accordingly, the parity replacer 308 selects the output of the data interleaver 307 as the data within the mobile service data packet, and the parity replacer 308 selects the output of the non-systematic RS encoder 309 as the RS parity data. Then, the selected data are outputted to the trellis encoding module 310.

Meanwhile, if the main service data packet is inputted or if the mobile service data packet, which does not include any initialization data place holders that are to be replaced, is inputted, the parity replacer 308 selects the data and RS parity that are outputted from the data interleaver 307. Then, the parity replacer 308 directly outputs the selected data to the trellis encoding module 310 without any modification. The trellis encoding module 310 converts the byte-unit data to symbol units and performs a 12-way interleaving process so as to trellis-encode the received data. Thereafter, the processed data are outputted to the second multiplexer 311.

The second multiplexer 311 inserts a field synchronization signal and a segment synchronization signal to the data outputted from the trellis encoding module 310 and, then, outputs the processed data to the pilot inserter 312. Herein, the data having a pilot inserted by the pilot inserter 312 are modulated by the modulator 313 in accordance with a pre-decided modulating method. Thereafter, the modulated data are transmitted to each receiving system through the radio frequency (RF) up-converter 314.

Figure 6:
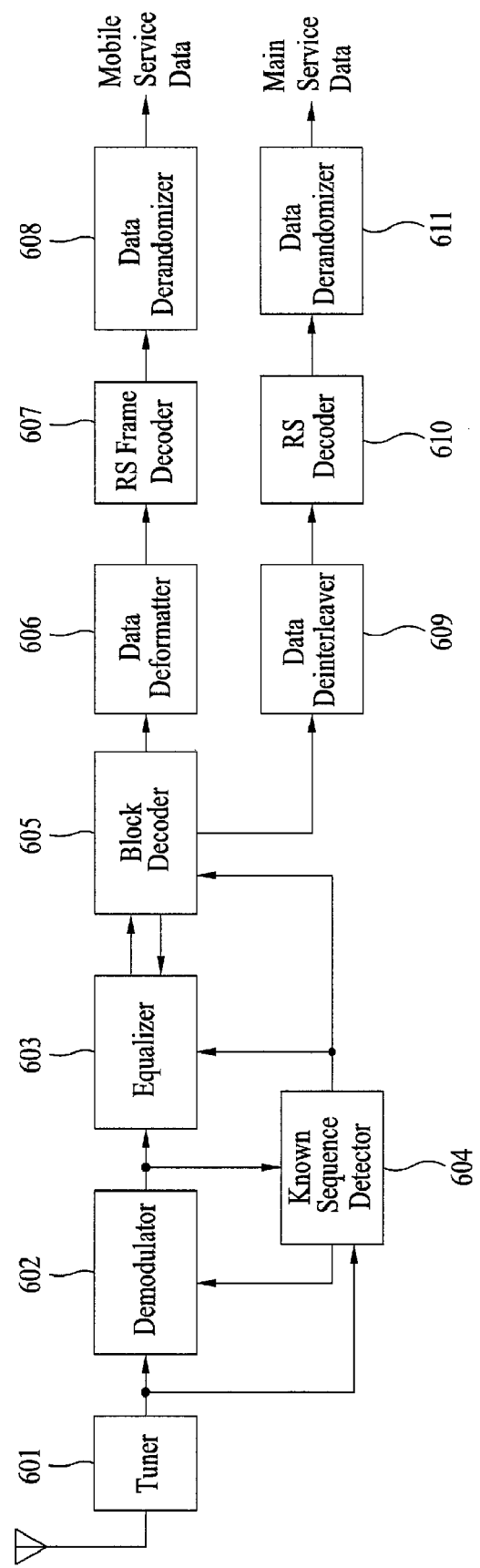
FIG. 6 illustrates a block diagram showing a structure of a digital broadcast receiving system according to the present invention.

FIG. 6 illustrates a block diagram showing a structure of a receiving system according to the present invention. The receiving system of FIG. 6 uses known data information, which is inserted in the mobile service data section and, then, transmitted by the transmitting system, so as to perform carrier synchronization recovery, frame synchronization recovery, and channel equalization, thereby enhancing the receiving performance. Referring to FIG. 6, the receiving system includes a tuner 601, a demodulator 602, an equalizer 603, a known sequence detector 604, a block decoder 605, a data deformatter 606, a RS frame decoder 607, a data derandomizer 608, a data deinterleaver 609, a RS decoder 610, and a data derandomizer 611. Herein, for simplicity of the description of the present invention, the data deformatter 606, the RS frame decoder 607, and the data derandomizer 608 will be collectively referred to as a mobile service data processing unit. And, the data deinterleaver 609, the RS decoder 610, and the data derandomizer 611 will be collectively referred to as a main service data processing unit.

More specifically, the tuner 601 tunes a frequency of a particular channel and down-converts the tuned frequency to an intermediate frequency (IF) signal. Then, the tuner 601 outputs the down-converted IF signal to the demodulator 602 and the known sequence detector 604. The demodulator 602 performs self gain control, carrier recovery, and timing recovery processes on the inputted passband IF signal, thereby modifying the IF signal to a baseband signal. Then, the demodulator 602 outputs the newly created baseband signal to the equalizer 603 and the known sequence detector 604. The equalizer 603 compensates the distortion of the channel included in the demodulated signal and then outputs the error-compensated signal to the block decoder 605.

At this point, the known sequence detector 604 detects the known sequence place inserted by the transmitting end from the input/output data of the demodulator 602 (i.e., the data prior to the demodulation process or the data after the demodulation process). Thereafter, the place information along with the symbol sequence of the known data, which are generated from the detected place, is outputted to the demodulator 602 and the equalizer 603. Also, the known sequence detector 604 outputs a set of information to the block decoder 605. This set of information is used to allow the block decoder 605 of the receiving system to identify the mobile service data that are processed with additional encoding from the transmitting system and the main service data that are not processed with additional encoding. In addition, although the connection status is not shown in FIG. 6, the information detected from the known sequence detector 604 may be used throughout the entire receiving system and may also be used in the data deformatter 606 and the RS frame decoder 607. The demodulator 602 uses the known data symbol sequence during the timing and/or carrier recovery, thereby enhancing the demodulating performance. Similarly, the equalizer 603 uses the known data so as to enhance the equalizing performance. Moreover, the decoding result of the block decoder 605 may be fed-back to the equalizer 603, thereby enhancing the equalizing performance.

Meanwhile, if the data being inputted to the block decoder 605, after being channel-equalized by the equalizer 603, correspond to the mobile service data having additional encoding and trellis encoding performed thereon by the transmitting system, trellis decoding and additional decoding processes are performed on the inputted data as inverse processes of the transmitting system. Alternatively, if the data being inputted to the block decoder 605 correspond to the main service data having only trellis encoding performed thereon, and not the additional encoding, only the trellis decoding process is performed on the inputted data as the inverse process of the transmitting system. The data group decoded by the block decoder 605 is outputted to the data deformatter 606, and the main service data are outputted to the data deinterleaver 609.

More specifically, if the inputted data correspond to the main service data, the block decoder 605 performs Viterbi decoding on the inputted data so as to output a hard decision value or to perform a hard-decision on a soft decision value, thereby outputting the result. Meanwhile, if the inputted data correspond to the mobile service data, the block decoder 605 outputs a hard decision value or a soft decision value with respect to the inputted mobile service data. In other words, if the inputted data correspond to the mobile service data, the block decoder 605 performs a decoding process on the data encoded by the block processor and trellis encoding module of the transmitting system.

At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 605 may output a hard decision value on the mobile service data. However, when required, it may be more preferable for the block decoder 605 to output a soft decision value.

Meanwhile, the data deinterleaver 609, the RS decoder 610, and the data derandomizer 611 are blocks required for receiving the main service data. Therefore, the above-mentioned blocks may be omitted from the structure of a receiving system that only receives the mobile service data. The data deinterleaver 609 performs an inverse process of the data interleaver included in the transmitting system. In other words, the data deinterleaver 609 deinterleaves the main service data outputted from the block decoder 605 and outputs the deinterleaved main service data to the RS decoder 610.

The RS decoder 610 performs a systematic RS decoding process on the deinterleaved data and outputs the processed data to the data derandomizer 611. The data derandomizer 611 receives the output of the RS decoder 610 and generates a pseudo random data byte identical to that of the randomizer included in the transmitting system. Thereafter, the data derandomizer 611 performs a bitwise exclusive OR (XOR) operation on the generated pseudo random data byte, thereby inserting the MPEG synchronization bytes to the beginning of each packet so as to output the data in 188-byte main service data packet units.

Meanwhile, the data being outputted from the block decoder 605 to the data deformatter 606 are inputted in the form of a data group. At this point, the data deformatter 606 already knows the structure of the data that are to be inputted and is, therefore, capable of identifying the signaling information, which includes the system information, and the mobile service data from the data group. Thereafter, the data deformatter 606 outputs the identified signaling information to a block for processing signaling information (not shown) and outputs the identified mobile service data to the RS frame decoder 607. At this point, the data deformatter 606 removes the known data, trellis initialization data, and MPEG header, which were inserted in the main service data and data group, and also removes the RS parity, which was added by the RS encoder/non-systematic RS encoder or non-systematic RS encoder of the transmitting system, from the corresponding data. Thereafter, the processed data are outputted to the RS frame decoder 607. More specifically, the RS frame decoder 607 receives only the RS encoded and/or CRC encoded mobile service data that are transmitted from the data deformatter 606.

The RS frame decoder 607 performs an inverse process of the RS frame encoder included in the transmitting system so as to correct the error within the RS frame. Then, the RS frame decoder 607 adds the 1-byte MPEG synchronization service data packet, which had been removed during the RS frame encoding process, to the error-corrected mobile service data packet. Thereafter, the processed data packet is outputted to the data derandomizer 608. The data derandomizer 608 performs a derandomizing process, which corresponds to the inverse process of the randomizer included in the transmitting system, on the received mobile service data. Thereafter, the derandomized data are outputted, thereby obtaining the mobile service data transmitted from the transmitting system.

As described above, the present invention has the following advantages. More specifically, the present invention is robust against (or resistant to) any error that may occur when transmitting mobile service data through a channel. And, the present invention is also highly compatible to the conventional system. Moreover, the present invention may also receive the mobile service data without any error even in channels having severe ghost effect and noise.

Additionally, by performing error correction encoding and error detection encoding processes on the mobile service data and transmitting the processed data, the present invention may provide robustness to the mobile service data, thereby enabling the data to effectively respond to the frequent change in channels. Also, when the present invention multiplexes the main service data and the mobile service data in a burst structure, a relative position of a main service data packet is re-adjusted and then multiplexed, thereby mitigating packet jitter, which may occur when the receiving system receives the multiplexed main service data packet.

Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A receiving system, comprising:
    a receiving unit configured to receive a broadcast signal, wherein the broadcast signal comprises mobile service data packets and main service data packets, the mobile service data packets being multiplexed with the main service data packets on a same channel, wherein the mobile service data packets include mobile audio data packets and mobile non-audio data packets for a mobile handheld broadcast receiver and the main service data packets include main audio data packets and main non-audio data packets for a conventional broadcast receiver,
    wherein the mobile service data packets further include mobile service data, the mobile service data being preprocessed by a transmitting side in steps comprising:
        RS (Reed Solomon) and CRC (cyclic redundancy check) encoding the mobile service data in an RS frame unit;
        converting data bytes of the RS and CRC encoded mobile service data into data bits of the mobile service data;
        encoding the data bits of the mobile service data at a coding rate of ½ or ¼;
        inserting an MPEG header place holder, a non-systematic RS parity place holder and a main service data place holder into a data group having the encoded mobile service data;
        deinterleaving data in the data group including the MPEG header place holder, the non-systematic RS parity place holder and the main service data place holder;
        removing the main service data place holder and the non-systematic RS parity place holder, replacing the MPEG header place holder with an MPEG header, and forming mobile service data packets including the mobile service data and the replaced MPEG header in the data group; and
        multiplexing the formed mobile service data packets with main service data packets,
    wherein the main service data packets are adjusted to compensate for temporal displacement of the main service data packets occurring due to the multiplexing of the mobile service data packets and main service data packets in a broadcast transmitter, and wherein a corresponding program clock reference (PCR) value is adjusted when at least one main service data packet is re-positioned;
a demodulating unit configured to demodulate the received broadcast signal; and
an error correction unit configured to perform error correction decoding on the mobile service data within the mobile service data packets of the demodulated broadcast signal in order to correct an error generated from the mobile service data.

2. The receiving system of claim 1, wherein signaling information is received by being inserted into the data group.

3. The receiving system of claim 2, wherein the signaling information includes at least data group information or multiplex information.

4. The receiving system of claim 1, further comprising:
a known data detector configured to detect a known data sequence from the data group.

5. The receiving system of claim 4, further comprising:
a channel equalizer configured to compensate for channel distortion generated from the mobile service data using the detected known data sequence.

6. The receiving system of claim 1, further comprising:
a block decoder configured to perform decoding by a block unit on the mobile service data within the mobile service data packets of the demodulated broadcast signal, and to output the decoded mobile service data for error correction.

7. The receiving system of claim 1, further comprising:
a derandomizer configured to derandomize the error-correction-decoded mobile service data.

8. A method of processing data in a receiving system, the method comprising:
receiving a broadcast signal, wherein the broadcast signal comprises mobile service data packets and main service data packets, the mobile service data packets being multiplexed with the main service data packets on a same channel, wherein the mobile service data packets include mobile audio data packets and mobile non-audio data packets for a mobile handheld broadcast receiver and the main service data packets include main audio data packets and main non-audio data packets for a conventional broadcast receiver,
wherein the mobile service data packets further include mobile service data, the mobile service data being pre-processed by a transmitting side in steps comprising:
RS (Reed Solomon) and CRC (cyclic redundancy check) encoding the mobile service data in an RS frame unit;
converting data bytes of the RS and CRC encoded mobile service data into data bits of the mobile service data;
encoding the data bits of the mobile service data at a coding rate of ½ or ¼;
inserting an MPEG header place holder, a non-systematic RS parity place holder and a main service data place holder into a data group having the encoded mobile service data;
deinterleaving data in the data group including the MPEG header place holder, the non-systematic RS parity place holder and the main service data place holder;
removing the main service data place holder and the non-systematic RS parity place holder, replacing the MPEG header place holder with an MPEG header, and forming mobile service data packets including the mobile service data and the replaced MPEG header in the data group; and
multiplexing the formed mobile service data packets with main service data packets,
wherein the main service data packets are adjusted to compensate for temporal displacement of the main service data packets occurring due to the multiplexing of the mobile service data packets and main service data packets in a broadcast transmitter, and wherein a corresponding program clock reference (PCR) value is adjusted when at least one main service data packet is re-positioned;
demodulating the received broadcast signal; and
performing error correction decoding on the mobile service data within the mobile service data packets of the demodulated broadcast signal in order to correct an error generated from the mobile service data.

9. The method of claim 8, wherein signaling information is received by being inserted into the data group.

10. The method of claim 9, wherein the signaling information includes at least data group information or multiplex information.

11. The method of claim 8, further comprising:
detecting a known data sequence from the data group.

12. The method of claim 11, further comprising:
compensating for channel distortion generated from the mobile service data using the detected known data sequence.

13. The method of claim 8, further comprising:
decoding the mobile service data within the mobile service data packets of the demodulated broadcast signal by a block unit; and
outputting the decoded mobile service data for error correction.

14. The method of claim 8, further comprising:
derandomizing the error-correction-decoded mobile service data.

15. A receiving system, comprising:
a receiving unit configured to receive a broadcast signal, wherein the broadcast signal comprises mobile service data packets and main service data packets, the mobile service data packets being multiplexed with the main service data packets on a same channel, wherein the mobile service data packets include mobile audio data packets and mobile non-audio data packets for a mobile handheld broadcast receiver and the main service data packets including main audio data packets and main non-audio data packets for a conventional broadcast receiver,
wherein the mobile service data packets further include mobile service data, the mobile service data being pre-processed by a transmitting side in steps comprising:
RS (Reed Solomon) and CRC (cyclic redundancy check) encoding the mobile service data in an RS frame unit;
converting data bytes of the RS and CRC encoded mobile service data into data bits of the mobile service data;
encoding the data bits of the mobile service data at a coding rate of ½ or ¼;
inserting an MPEG header place holder, a non-systematic RS parity place holder and a main service data place holder into a data group having the encoded mobile service data;

deinterleaving data in the data group including the MPEG header place holder, the non-systematic RS parity place holder and the main service data place holder;

removing the main service data place holder and the non-systematic RS parity place holder, replacing the MPEG header place holder with an MPEG header, and forming mobile service data packets including the mobile service data and the replaced MPEG header in the data group; and multiplexing the formed mobile service data packets with main service data packets, wherein the main service data packets are adjusted in order to compensate for changes to an emission time of the main service data packets resulting from the multiplexing of the main service data packets with the mobile service data packets in a broadcast transmitter, and wherein a corresponding program clock reference (PCR) value is adjusted when at least one main service data packet is re-positioned; a demodulating unit configured to demodulate the received broadcast signal; and an error correction unit configured to perform error correction decoding on the mobile service data within the mobile service data packets of the demodulated broadcast signal in order to correct an error generated from the mobile service data.

16. A method of processing data in a receiving system, the method comprising:

receiving a broadcast signal, wherein the broadcast signal comprises mobile service data packets and main service data packets, the mobile service data packets being multiplexed with the main service data packets on a same channel, wherein the mobile service data packets include mobile audio data packets for a mobile handheld broadcast receiver and the mobile non-audio data packets and main service data packets include main audio data packets and main non-audio data packets for a conventional broadcast receiver, wherein the mobile service data packets include mobile service data, the mobile service data being pre-processed by a transmitting side in steps comprising:

RS (Reed Solomon) and CRC (cyclic redundancy check) encoding the mobile service data in an RS frame unit;

converting data bytes of the RS and CRC encoded mobile service data into data bits of the mobile service data;

encoding the data bits of the mobile service data at a coding rate of ½ or ¼;

inserting an MPEG header place holder, a non-systematic RS parity place holder and a main service data place holder into a data group having the encoded mobile service data;

deinterleaving data in the data group including the MPEG header place holder, the non-systematic RS parity place holder and the main service data place holder;

removing the main service data place holder and the non-systematic RS parity place holder, replacing the MPEG header place holder with an MPEG header, and forming mobile service data packets including the mobile service data and the replaced MPEG header in the data group; and multiplexing the formed mobile service data packets with main service data packets, wherein the main service data packets are adjusted in order to compensate for changes to an emission time of the main service data packets resulting from the multiplexing of the main service data packets with the mobile service data packets in a broadcast transmitter, and wherein a corresponding program clock reference (PCR) value is adjusted when at least one main service data packet is re-positioned;

demodulating the received broadcast signal; and performing error correction decoding on the mobile service data within the mobile service data packets of the demodulated broadcast signal in order to correct an error generated from the mobile service data.

17. The receiving system of claim 1, wherein:

the data group has a plurality of data regions; and mobile service data in each data region is encoded at the coding rate of ½ or ¼ independently.

18. The method of claim 8, wherein:

the data group has a plurality of data regions; and mobile service data in each data region is encoded at the coding rate of ½ or ¼ independently.

* * * * *